United States Patent
Lu et al.

(10) Patent No.: US 10,333,007 B2
(45) Date of Patent: Jun. 25, 2019

(54) SELF-ALIGNED CONTACT (SAC) ON GATE FOR IMPROVING METAL OXIDE SEMICONDUCTOR (MOS) VARACTOR QUALITY FACTOR

(71) Applicant: QUALCOMM Incorporated, San Diego, CA (US)

(72) Inventors: Ye Lu, San Diego, CA (US); Yun Yue, San Diego, CA (US); Chuan-Hsing Chen, San Diego, CA (US); Bin Yang, San Diego, CA (US); Lixin Ge, San Diego, CA (US); Ken Liao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/686,827

(22) Filed: Aug. 25, 2017

(65) Prior Publication Data
US 2018/0366592 A1    Dec. 20, 2018

Related U.S. Application Data

(60) Provisional application No. 62/522,002, filed on Jun. 19, 2017.

(51) Int. Cl.
| H01L 29/93 | (2006.01) |
| H01L 29/66 | (2006.01) |
| H01L 29/423 | (2006.01) |
| H01L 29/45 | (2006.01) |
| H01L 23/482 | (2006.01) |

(Continued)

(52) U.S. Cl.
CPC .......... *H01L 29/93* (2013.01); *H01L 23/485* (2013.01); *H01L 23/4824* (2013.01); *H01L 23/66* (2013.01); *H01L 29/4232* (2013.01); *H01L 29/456* (2013.01); *H01L 29/66174* (2013.01); *H01L 2223/6677* (2013.01)

(58) Field of Classification Search
CPC ... H01L 29/93; H01L 29/4232; H01L 29/456; H01L 29/66174
USPC ......................................................... 257/312
See application file for complete search history.

(56) References Cited

U.S. PATENT DOCUMENTS

| 7,053,465 B2 | 5/2006 | Benaissa et al. |
| 7,611,956 B2 | 11/2009 | Kim et al. |
| 8,013,379 B2 | 9/2011 | Futatsugi |

(Continued)

FOREIGN PATENT DOCUMENTS

WO    2011073635    6/2011

OTHER PUBLICATIONS

International Search Report and Written Opinion—PCT/US2018/036918—ISA/EPO—dated Sep. 28, 2018.

*Primary Examiner* — Jami Valentine Miller
(74) *Attorney, Agent, or Firm* — Qualcomm Incorporated/Seyfarth Shaw LLP

(57) ABSTRACT

A short-channel metal oxide semiconductor varactor may include a source region of a first polarity having a source via contact. The varactor may further include a drain region of the first polarity having a drain via contact. The varactor may further include a channel region of the first polarity between the source region and the drain region. The channel region may include a gate. The varactor may further include at least one self-aligned contact (SAC) on the gate and between the source via contact and the drain via contact.

19 Claims, 11 Drawing Sheets

(51) Int. Cl.
   *H01L 23/485* (2006.01)
   *H01L 23/66* (2006.01)

(56) References Cited

U.S. PATENT DOCUMENTS

| | | |
|---|---|---|
| 8,217,497 B2 | 7/2012 | Orner et al. |
| 8,658,524 B2 | 2/2014 | Herberholz et al. |
| 9,543,383 B2 | 1/2017 | Du et al. |
| 2005/0045888 A1* | 3/2005 | Kadowaki .......... H01L 27/0629 257/69 |
| 2005/0179113 A1 | 8/2005 | Kim et al. |
| 2006/0097906 A1 | 5/2006 | Heide et al. |
| 2012/0139020 A1 | 6/2012 | Chen et al. |

\* cited by examiner

SELF-ALIGNED CONTACT (SAC) ON GATE FOR IMPROVING METAL OXIDE SEMICONDUCTOR (MOS) VARACTOR QUALITY FACTOR

CROSS-REFERENCE TO RELATED APPLICATION

The present application claims the benefit of U.S. Provisional Patent Application No. 62/522,002, filed on Jun. 19, 2017, and titled "SELF-ALIGNED CONTACT (SAC) ON GATE FOR IMPROVING METAL OXIDE SEMICONDUCTOR (MOS) VARACTOR QUALITY FACTOR," the disclosure of which is expressly incorporated by reference herein in its entirety.

BACKGROUND

Field

Aspects of the present disclosure relate to semiconductor devices, and more particularly to self-aligned gate contacts for improving metal oxide semiconductor (MOS) varactor quality (Q)-factor.

Background

Mobile radio frequency (RF) chip designs (e.g., mobile RF transceivers) are complicated by the use of passive devices, which directly affect analog/RF performance considerations, including mismatch, noise, and other performance considerations. Passive devices may involve high performance inductor and capacitor components. For example, an RF module (e.g., an RF front end (RFFE) module) may include inductors (L) and capacitors (C) arranged to form filters and other RF devices. Arrangements of these passive devices may be selected to improve device performance, while suppressing unwanted noise (e.g., artificial harmonics) to support advanced RF applications.

The design of mobile RF transceivers may include the use of a voltage-controlled capacitance and/or a tunable capacitor (e.g., a varactor) for advanced RF applications. For example, tunable capacitors may provide RF and impedance matching in RF circuits of advanced RF applications. In these advanced RF technologies, short gate length (Lg) or short-channel MOS varactors having a high quality (Q)-factor are desired. Unfortunately, short-channel/gate length MOS varactors may exhibit an undesirable quality factor due to increased gate resistance.

SUMMARY

A short-channel metal oxide semiconductor varactor may include a source region of a first polarity having a source via contact. The varactor may further include a drain region of the first polarity having a drain via contact. The varactor may further include a channel region of the first polarity between the source region and the drain region. The channel region may include a gate. The varactor may further include at least one self-aligned contact (SAC) on the gate and between the source via contact and the drain via contact.

A radio frequency (RF) front end module may include a filter having a die. A substrate may support the die. A molding compound may surround the die. The RF front end module may further include a short-channel metal oxide semiconductor (MOS) varactor including a source region of a first polarity having a source via contact. The varactor may further include a drain region of the first polarity having a drain via contact. The varactor may further include a channel region of the first polarity between the source region and the drain region. The channel region may include a gate. The varactor may further include at least one self-aligned contact (SAC) on the gate and between the source via contact and the drain via contact. An antenna may be coupled to an output of the filter.

A method of fabricating a short-channel metal oxide semiconductor varactor may include coupling a source via contact to a source region of a first polarity. The method may further include coupling a drain via contact to a drain region of the first polarity. The method may further include fabricating at least one self-aligned contact (SAC) on a gate on a channel region of the first polarity. The at least one SAC may be disposed between the source via contact and the drain via contact.

A short-channel metal oxide semiconductor varactor may include a source region of a first polarity having a source via contact. The varactor may further include a drain region of the first polarity having a drain via contact. The varactor may further include a channel region of the first polarity between the source region and the drain region. The channel region may include a gate. The varactor may further include means for contacting the gate. The gate contacting means may be between the source via contact and the drain via contact.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 7A-7C illustrate top views of various exemplary configurations of short-channel metal oxide semiconductor (MOS) varactors, according to aspects of the present disclosure.

DETAILED DESCRIPTION

Figure 1:
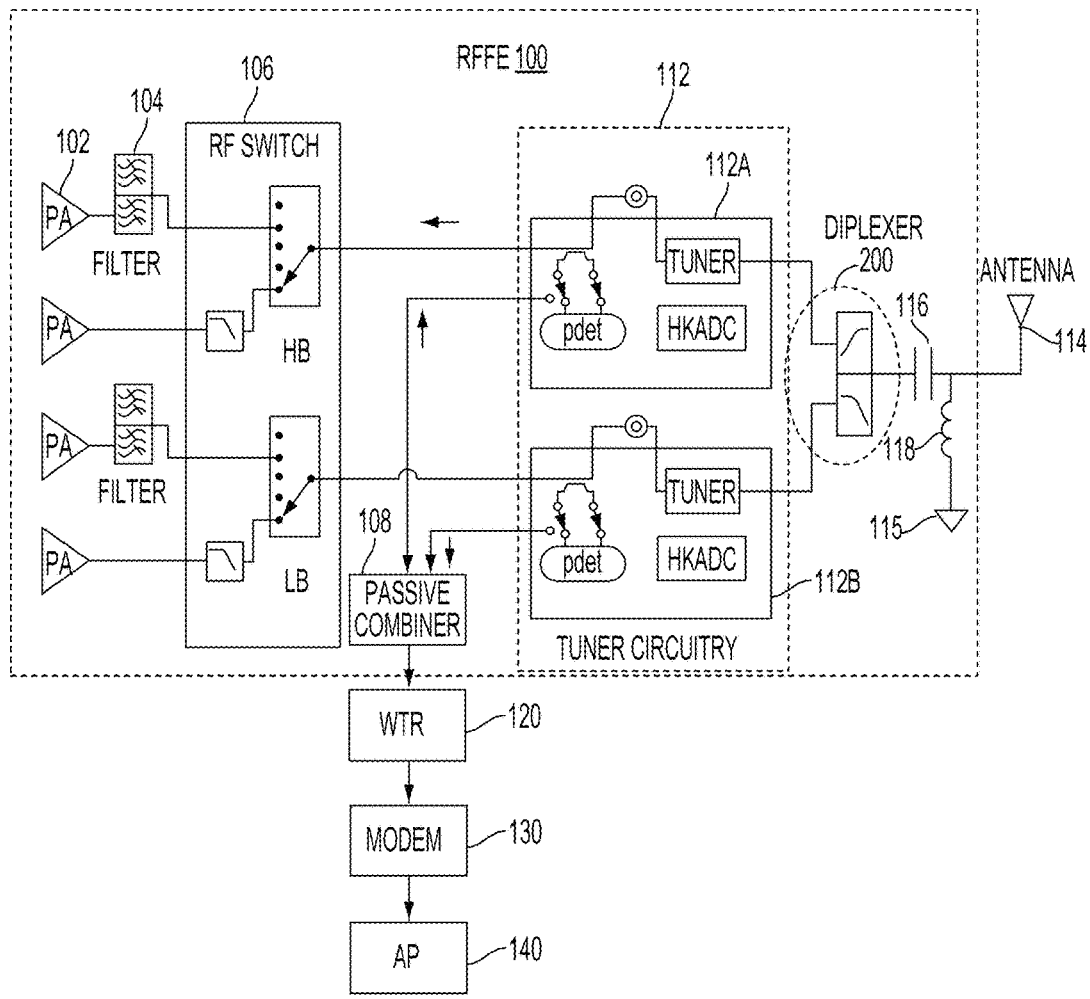
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip designs (e.g., mobile RF transceivers) are complicated by the use of passive devices, which directly affect analog/RF performance considerations, including mismatch, noise, and other performance considerations. Passive devices may involve high performance inductor and capacitor components. For example, an RF module (e.g., an RF front end (RFFE) module) may include inductors (L) and capacitors (C) arranged to form diplexers, triplexers, multiplexers, low pass filters, balun filters, and/or notch filters to prevent high order harmonics. Arrangements of these passive devices may be selected to improve device performance, while suppressing unwanted noise (e.g., artificial harmonics) to support advanced RF applications, such as carrier aggregation.

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

The design of mobile RF transceivers may include the use of a voltage-controlled capacitance and/or a tunable capacitor (e.g., a varactor), for example, to provide a voltage-controlled oscillator. Varactors may also be known as variable capacitance diodes. For example, tunable capacitors may provide RF and impedance matching in RF circuits. A complementary metal oxide semiconductor (CMOS) tunable capacitor may be tuned by varying a bias across a dielectric in the capacitor, which enables variation of the capacitance.

In advanced RF circuits, a MOS varactor may provide a tunable capacitor. This MOS varactor is an example of an electrical device used to store energy (e.g., charge) in an electrical field between closely spaced capacitor plates according to a capacitance value. This capacitance value provides a measure of the amount of charge stored by the capacitor at a certain voltage. In addition to their charge storing capability, capacitors are also useful as electronic filters because they enable differentiation between high frequency and low frequency signals. In a conventional varactor a plate width modulates to vary an electric field formed between the capacitor plates. This varactor provides an electrically controllable capacitance that can be used in tuned circuits.

While the use of varactors is advantageous in many applications (e.g., due to small size and reduced cost), varactors generally exhibit a lower quality (Q)-factor and non-linearity because varactors are asymmetric devices. That is, the quality factor of a varactor is a significant parameter. The quality factor may be defined as the imaginary part of a varactor impedance divided by the real part of the varactor impedance. Thus, the quality factor of the varactor is improved by reducing the real part of the varactor impedance (e.g., its parasitic resistance).

The real part of the varactor impedance is controlled by two factors: (1) a gate resistance—due to the contact to gate resistance; and (2) a channel resistance of the varactor channel between diffusion regions. The channel resistance may be reduced by reducing the channel length (e.g., from 150 nanometers (nm) to 80 nm). In current process nodes (e.g., 28 nm channel length), however, further reduction in the channel length actually decreases the quality factor relative to, for example, the 80 nm channel length. That is, reducing the channel resistance is not possible by further reduction of the channel length, because this reduction increases the gate resistance, which becomes the primary component of the parasitic resistance.

Parasitic resistance of a MOS varactor, therefore, is generally controlled by an effective gate resistance (Rgate). For example, the quality factor of a device with a short gate length (e.g., Lg=28 nm) may be lower than that of a longer gate device (e.g., Lg=80 nm). This discrepancy may be caused by an increased gate resistance due to a reduced channel length, which may equal the gate length. In advanced RF technologies, short-channel (or short gate length (Lg)) MOS varactors having a high quality factor are desired; however, these are not easily obtained due to increased gate resistance. This gate resistance may be affected by gate contacts from interconnect layers used to connect back-end-of-line interconnects to the gate of on an RF integrated circuit.

Interconnect layers are often used to connect different devices together on an integrated circuit. Semiconductor processes for fabricating integrated circuits are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process includes gate and terminal contact formation. Back-end-of-line processes include forming interconnects and dielectric layers for coupling to the FEOL devices. The gate and terminal contact formation of the middle-of-line process, however, may have a detrimental effect on the gate resistance due to the interconnect layers used to connect different devices.

The interconnect layers may include front-end-of-line interconnect layers, middle-of-line interconnect layers, and back-end-of-line interconnect layers. As described herein, the middle-of-line interconnect layers may refer to the conductive interconnects for connecting a first back-end-of-line interconnect layer (e.g., metal 1 (M1)) to the oxide diffusion (OD) layer of an integrated circuit, as well as for connecting M1 to the active devices of the integrated circuit. The middle-of-line interconnect layers for connecting M1 to the source/drain layer of an integrated circuit may be referred to as contact to active (CA) trench contacts. The middle-of-line interconnect layer for connecting M1 to the gates of an integrated circuit may be referred to as contact to open (CB) contacts.

According to aspects of the present disclosure, conventional gate contacts are replaced with a long self-aligned contact (LSAC) or multiple self-aligned contacts (MSACs) on an active gate to form a short-channel metal oxide semiconductor varactor. These self-aligned contacts may reduce an effective gate resistance by more than a factor of sixteen (e.g., 16 times). This improvement results when, for example, a long self-aligned contact equals two self-aligned contacts (e.g., 1 LSAC=2 SACs). This reduction in the effective gate resistance may significantly improve a MOS varactor quality factor (e.g., by more than 15.6 times).

FIG. 1 is a schematic diagram of a radio frequency (RF) front end (RFFE) module 100 that may include varactors. The RF front end module 100 includes power amplifiers 102, duplexer/filters 104, and a radio frequency (RF) switch module 106. The power amplifiers 102 amplify signals to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), a diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 2:
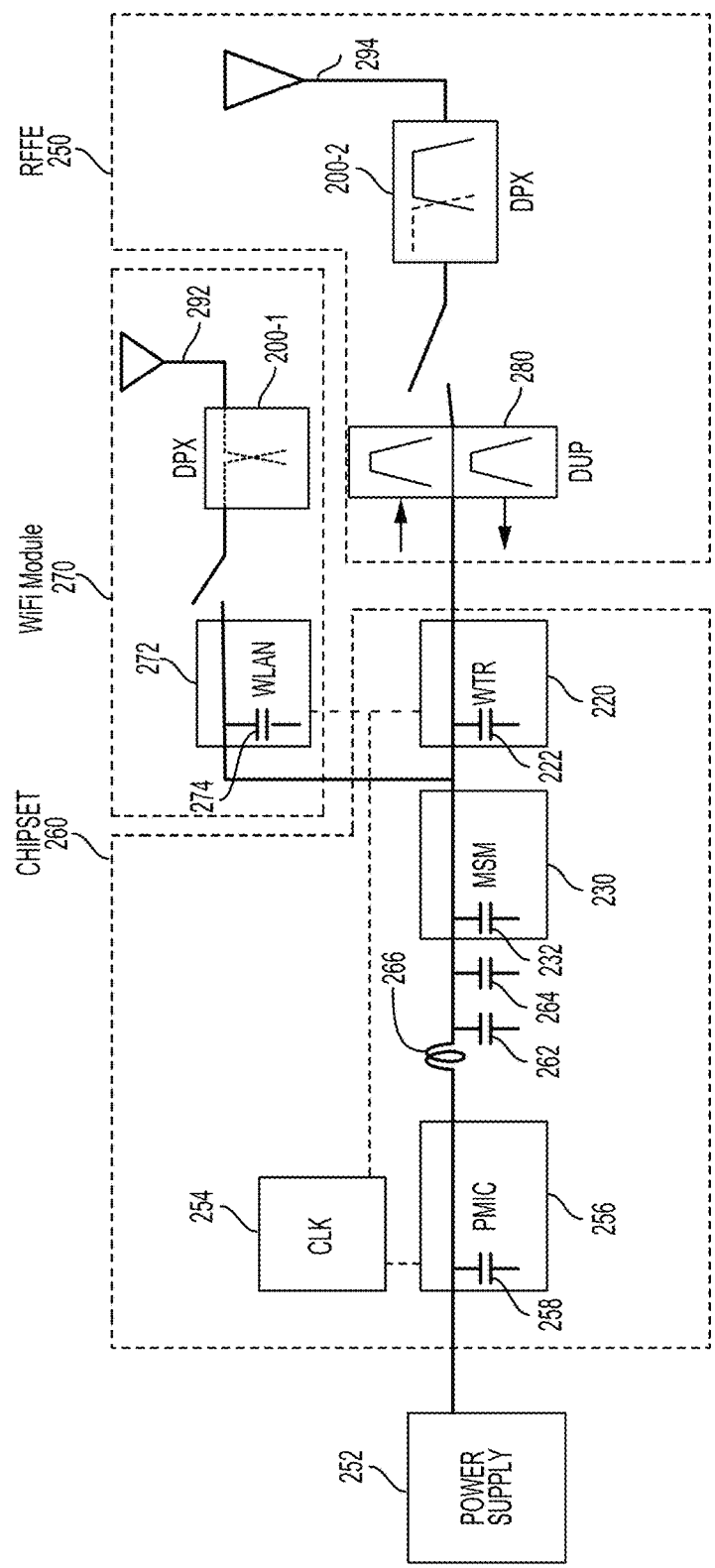
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 270 including an RF front end (RFFE) module 250 for a chipset 260 to provide, for example, carrier aggregation. The WiFi module 270 includes the first diplexer 200-1 communicably coupling an antenna 292 to a wireless local area network module (e.g., WLAN module 272). The RF front end module 250 includes the second diplexer 200-2 communicably coupling an antenna 294 to the wireless transceiver (WTR) 220 through a duplexer 280. The wireless transceiver 220 and the WLAN module 272 of the WiFi module 270 are coupled to a modem (MSM, e.g., baseband modem) 230 that is powered by a power supply 252 through a power management integrated circuit (PMIC) 256. The chipset 260 also includes capacitors 262 and 264, as well as an inductor(s) 266 to provide signal integrity. The PMIC 256, the modem 230, the wireless transceiver 220, and the WLAN module 272 each include capacitors (e.g., 258, 232, 222, and 274) and operate according to a clock 254.

The geometry and arrangement of the various inductor and capacitor components in the chipset 260 may reduce the electromagnetic coupling between the components. Capacitors are passive elements used in integrated circuits for storing an electrical charge. The design of RF front end module 100 may include the use of a voltage-controlled capacitance and/or a tunable capacitor (e.g., a varactor), for example.

Figure 3:
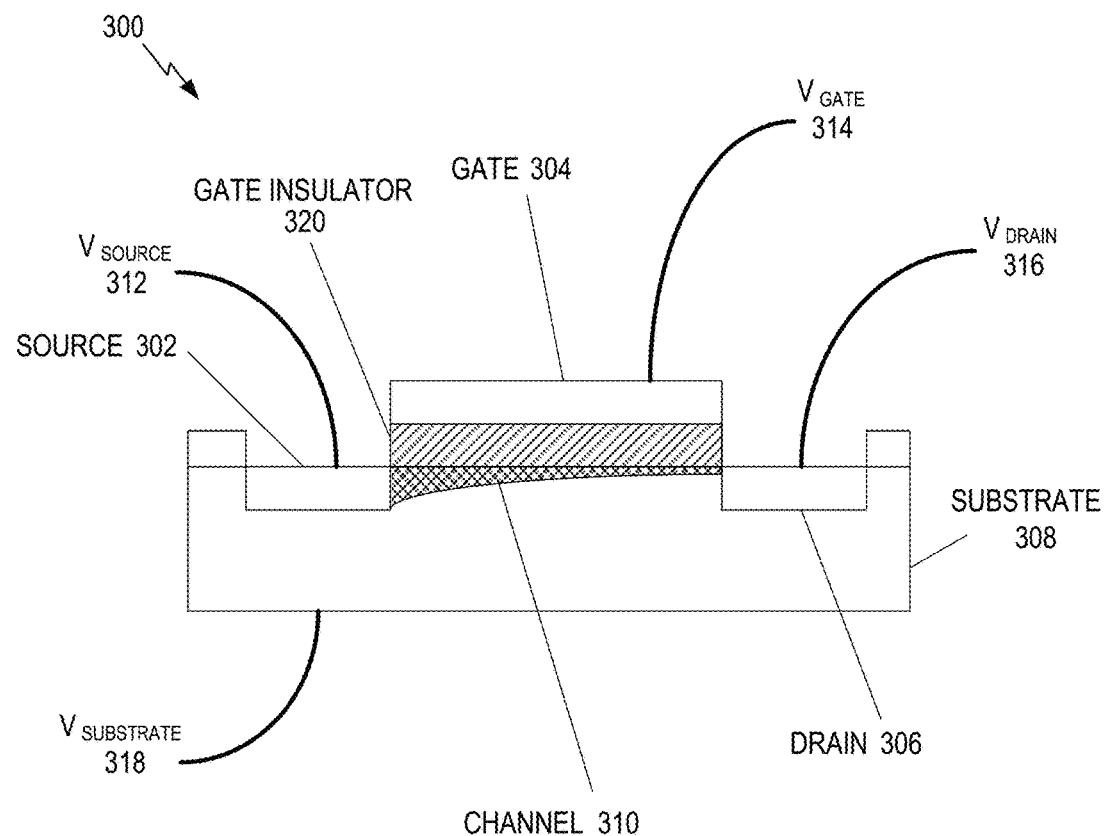
FIG. 3 illustrates a cross-sectional view of a metal oxide semiconductor field-effect transistor (MOSFET) device.
Figure 3:
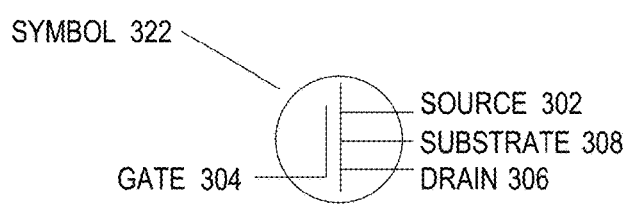

FIG. 3 illustrates a cross-sectional view of a metal oxide semiconductor field-effect transistor (MOSFET) device 300. The MOSFET device 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the substrate 308. Such other structures may be a fin or other structure that protrudes from a surface of the substrate 308. Further, the substrate 308 may be the substrate of the die, but the substrate 308 may also be one or more of the layers (e.g., 210-214) that are coupled to the substrate 308.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die (e.g., semiconductor substrate), interconnect traces or layers are used. These interconnect traces may be in one or more of layers (e.g., 210-214), or may be in other layers of the substrate 308 (or a die). These interconnects may affect a gate resistance, as described herein.

Figure 4:
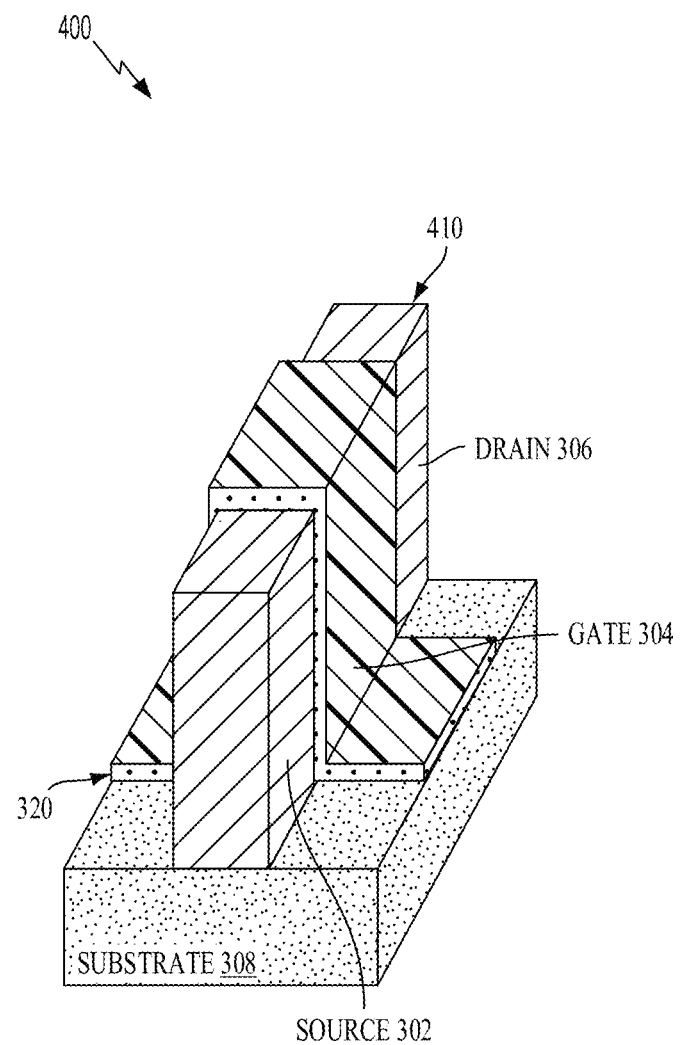
FIG. 4 illustrates a fin field-effect transistor (FinFET).

FIG. 4 illustrates a fin-structured FET (FinFET) 400 that operates in a similar fashion to the MOSFET device 300 described with respect to FIG. 3. A fin 410 in the FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A FinFET transistor is a 3D fin-based metal oxide semiconductor field-effect transistor (MOSFET). As a result, the physical size of the FinFET 400 may be smaller than the MOSFET device 300 structure shown in FIG. 3. This reduction in physical size allows for more devices per unit area on the die.

Figure 5:
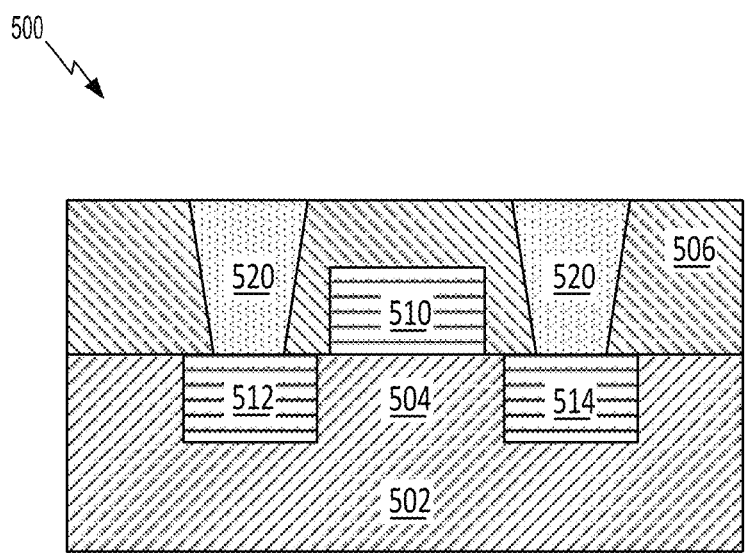
FIG. 5 illustrates a conventional metal oxide semiconductor (MOS) varactor.

FIG. 5 illustrates a conventional metal oxide semiconductor (MOS) varactor 500. In advanced RF circuits, the MOS varactor 500 may provide a tunable capacitor. The MOS varactor 500 may include a source region 512, a drain region 514, and a channel 504 formed between the source region 512 and the drain region 514 in a substrate 502. A gate 510 is on the channel 504, and a gate dielectric (not shown) may be between the gate 510 and the channel 504. Middle-of-line trench contacts 520 to the source region 512 and the drain region 514 are also shown. In addition, the MOS varactor 500 includes a dielectric layer 506.

This MOS varactor 500 is an example of an electrical device used to store energy (e.g., charge) in an electrical field between closely spaced capacitor plates (e.g., the gate 510 and the channel 504) according to a capacitance value. This capacitance value provides a measure of the amount of charge stored by the capacitor at a certain voltage. In the MOS varactor 500, a plate width (e.g., the channel 504) modulates (e.g., according to the source region 512 and the drain region 514) to vary an electric field formed between the capacitor plates (e.g., the gate 510 and the channel 504).

The MOS varactor 500 is desirable because it proves an electrically controllable capacitance that can be used in RF circuits. While the use of varactors is advantageous in many applications (e.g., due to small size and reduced cost), varactors generally exhibit a lower quality (Q)-factor and non-linearity because varactors are asymmetric devices. One of the significant parameters for a MOS varactor is its quality factor. The quality factor may be defined as:

$$\text{Imaginary part of varactor impedance/real part of varactor impedance} \qquad (1)$$

As illustrated by equation (1), the quality factor of the conventional MOS varactor 500 may be improved by reducing the real part of the varactor impedance (e.g., its parasitic resistance). The real part of the varactor impedance is controlled by two factors: (1) a gate resistance—due to the contact to gate resistance; and (2) a channel resistance of the varactor channel between diffusion regions. The channel resistance may be reduced by reducing the channel length (e.g., from 150 nanometers (nm) to 80 nm). In current process nodes (e.g., 28 nm channel length), however, further reduction in the channel length actually decreases the quality factor relative to, for example, the 80 nm channel length. That is, the gate resistance becomes the primary component of the parasitic resistance because further reduction of the channel length increases the gate resistance.

Parasitic resistance of a MOS varactor, therefore, is generally controlled by an effective gate resistance (Rgate). For example, the quality factor of a device with a short gate length (e.g., Lg=28 nm) may be lower than that of a longer gate device (e.g., Lg=80 nm). This discrepancy may be caused by an increased gate resistance due to a reduced channel length, which may equal the gate length. In advanced RF technologies, short-channel (or short gate length (Lg)) MOS varactors having a high quality factor are desired; however, these are not easily obtained due to increased gate resistance. This gate resistance may be affected by gate contacts from interconnect layers used to connect back-end-of-line interconnects to the gate of an RF integrated circuit.

According to aspects of the present disclosure, conventional gate contacts are replaced with a long self-aligned contact (LSAC) or multiple self-aligned contacts (MSACs) on an active gate of a MOS varactor. These self-aligned contacts (SACs) may reduce an effective gate resistance by a factor of sixteen (e.g., by more than 16 times). For example, when a long self-aligned contact equals two self-aligned contacts (e.g., 1 LSAC=2 SACs), the gate resistance is reduced by a factor of sixteen. This reduction in the effective gate resistance may significantly improve the MOS varactor quality factor (e.g., by more than 15.6 times).

Figure 6A:
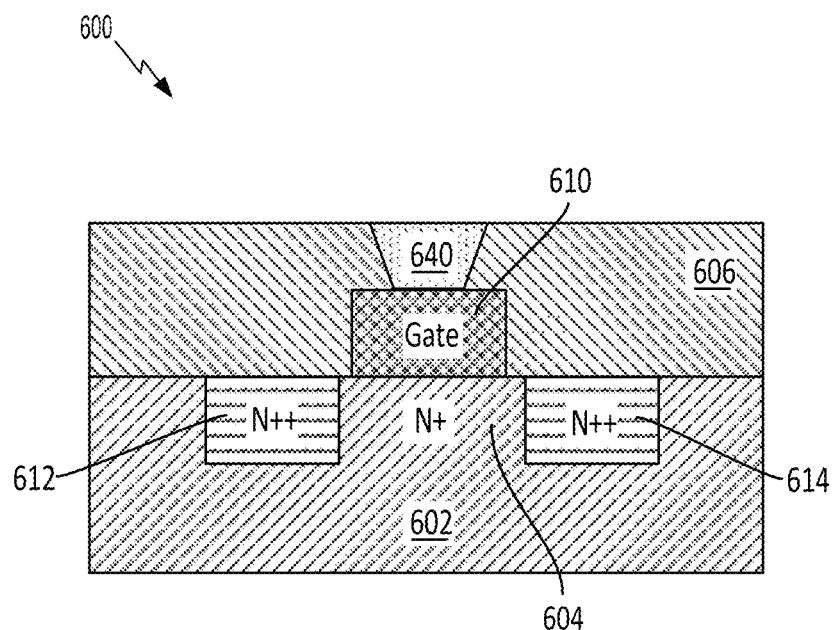
FIG. 6A illustrates a cross-sectional view of a short-channel metal oxide semiconductor (MOS) varactor, according to aspects of the present disclosure.

FIGS. 6A illustrates a cross-sectional view of a short-channel metal oxide semiconductor (MOS) varactor 600, according to aspects of the present disclosure. The MOS varactor 600 may include a source region 612, a drain region 614, and a channel 604 between the source region 612 and the drain region 614. In addition, a gate 610 is on the channel 604. In this example, a length (Lg) of the gate 610 may be less than 50 nm (e.g., 14 nm and/or 28 nm). Additionally, the source region 612 and the drain region 614 may each be doped with a first polarity (e.g., N++), and the channel 604 may also be doped with the first polarity (N+). The source region 612, the drain region 614, and the channel 604 may be formed in a substrate 602. A dielectric 606 (e.g., molding compound) may be deposited on the substrate 602.

According to aspects of the present disclosure, a self-aligned gate contact 640 (e.g., at least one self-aligned contact (SAC)) may be formed through the dielectric 606 to couple to the gate 610. The self-aligned gate contact 640 may be a long self-aligned contact (LSAC) or multiple self-aligned contacts (MSACs). A shape of the self-aligned gate contact 640 may be cylindrical or square shaped, having a width greater than the length Lg of the gate 610. For example, the self-aligned gate contact 640 may be a self-aligned gate contact via between source and drain contacts in an active area.

According to aspects of the present disclosure, the self-aligned contact may be composed of copper (Cu), tungsten (W), nickel (Ni), aluminum (Al), gold (Au), silver (Ag), titanium (Ti), and/or graphene.

According to an aspect, the short-channel MOS varactor 600 may be formed according to a configuration similar to the FinFET 400 of FIG. 4. Alternatively, the short-channel MOS varactor may 600 be formed as a planar-based device according to a configuration similar to the MOSFET device 300 of FIG. 3, or as a gate all around (GAA) MOS varactor (not shown).

Figure 6B:
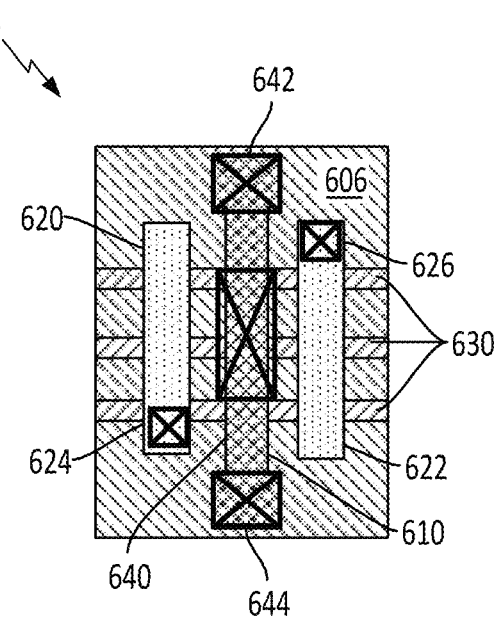
FIG. 6B illustrates a top view of a short-channel metal oxide semiconductor (MOS) varactor, according to aspects of the present disclosure.

FIG. 6B illustrates a top view of the short-channel metal oxide semiconductor (MOS) varactor 600, according to aspects of the present disclosure. The gate 610 may extend over and contact multiple semiconductor fins 630. In addition, a trench source contact 620 and a trench drain contact 622 are also shown. In this arrangement, the self-aligned gate contact 640 is located between a source contact 624 (e.g., a source contact via) of the trench source contact 620 and a drain contact 626 (e.g., drain contact via) of the trench drain contact 622.

For example, a length the self-aligned gate contact 640 may extend an entire length between the source contact 624 and the drain contact 626. The self-aligned gate contact 640 is between a first end gate contact 642 and a second end gate contact 644, which may be self-aligned contacts. In this example, the self-aligned gate contact 640 may be referred to as a long self-aligned contact. In addition, a width of the self-aligned gate contact 640 may be greater than a gate length Lg of the gate 610. This arrangement of the self-aligned gate contact 640 improves a quality factor of the MOS varactor 600 by reducing the contact to gate resistance due to the larger contact area of the self-aligned gate.

Figure 7C:
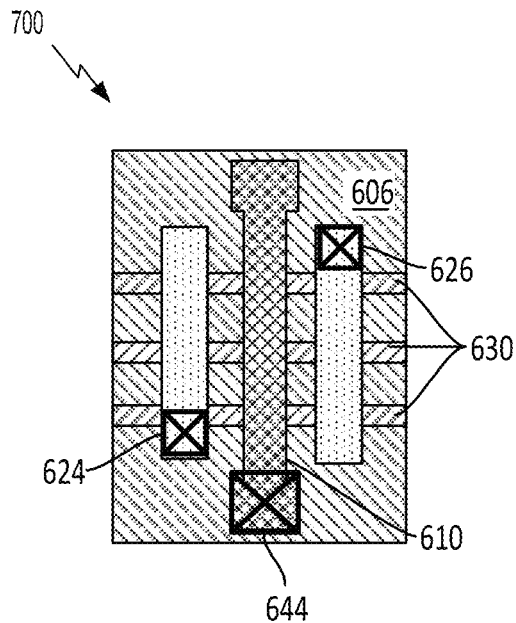
Figure 7C:
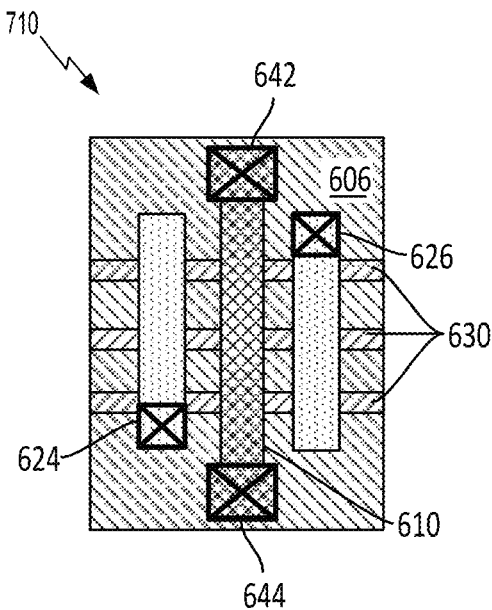
Figure 7C:
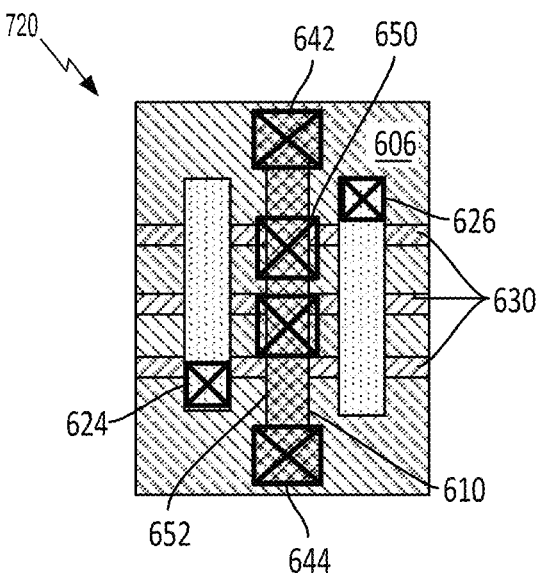

FIGS. 7A-7C illustrate top views of various exemplary configurations of the short-channel metal oxide semiconductor (MOS) varactor 600, according to aspects of the present disclosure.

FIG. 7A illustrates a MOS varactor 700 with a second end gate contact 644. FIG. 7B illustrates a MOS varactor 710 with a first end gate contact 642 and a second end gate contact 644. These gate contacts may be self-aligned and on opposite ends of the gate 610. FIG. 7C illustrates a MOS varactor 720 with a similar configuration to the MOS varactor 600 shown in FIG. 6B. In this arrangement, the self-aligned gate contact 640 is replaced with multiple self-aligned contacts (MSACs), including a first self-aligned gate contact 650 and a second self-aligned gate contact 652, between the source contact 624 and the drain contact 626. For example, the self-aligned gate contact 640 between the source contact 624 and the drain contact 626 may be a long self-aligned contact, as shown in FIG. 6B or multiple self-aligned contacts (e.g., 650, 652), as shown in FIG. 7C. According to an aspect of the present disclosure, the long self-aligned contact may be equivalent to greater than four non-aligned contacts.

Figure 8:
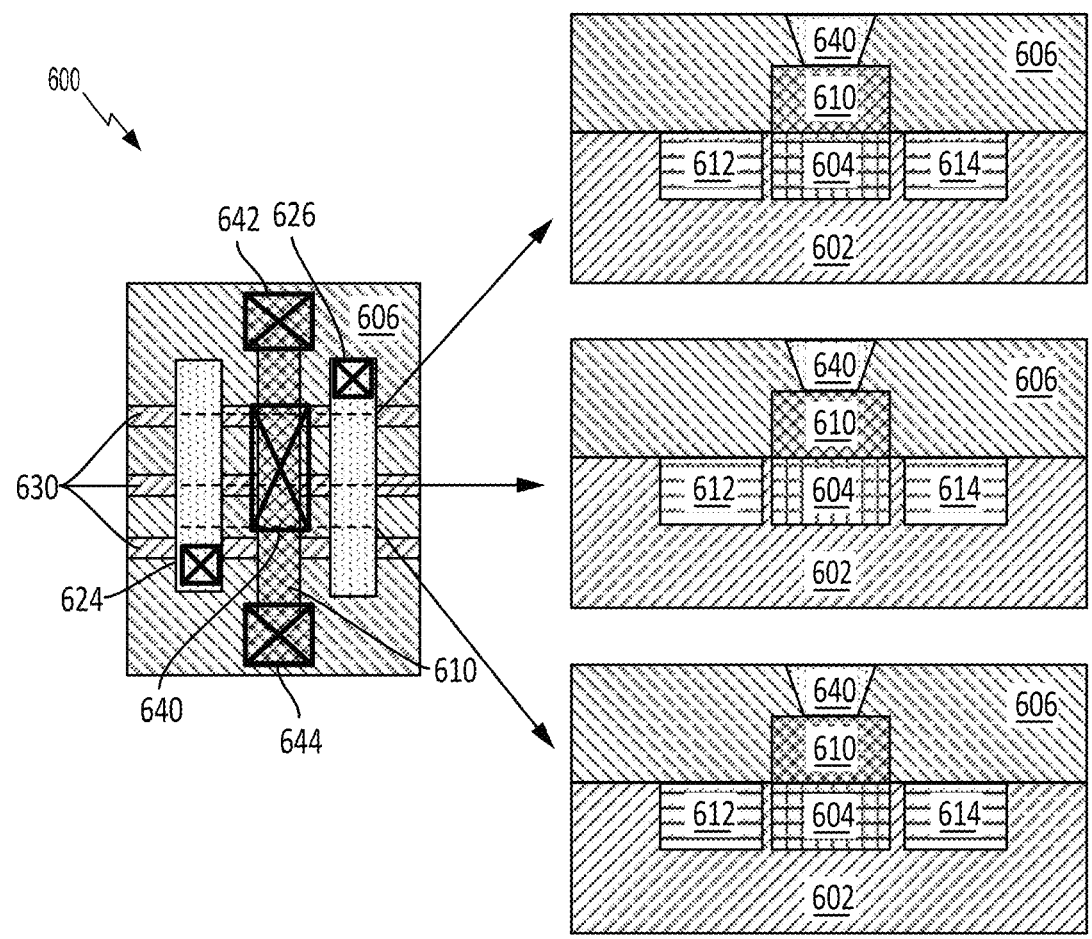
FIG. 8 illustrates a top view of a short-channel metal oxide semiconductor (MOS) varactor and cross-sectional views of the MOS varactor at various cross-sections, according to aspects of the present disclosure.

FIG. 8 illustrates a top view of the short-channel metal oxide semiconductor (MOS) varactor 600 of FIG. 6B, and cross-sectional views of the MOS varactor 600 at various cross-sections, according to aspects of the present disclosure. As shown, the self-aligned gate contact 640 may be formed along the gate 610 at any location along an entire length between the source contact 624 and the drain contact 626. For example, many SACs (e.g., as many as the gate width allows) are placed on MOS varactor devices for reducing the gate resistance and increasing the quality factor. This is especially advantageous for RF circuits for 5G technology, such as millimeter wave applications (e.g., extremely high frequency (EHF) spectrum from 30 to 300 GHz).

According to aspects of the present disclosure, self-aligned contacts (SACs) reduce an effective gate resistance by a factor of sixteen (e.g., more than 16 times). For example, a long self-aligned contact may be equal to two self-aligned contacts (e.g., 1 LSAC=2 SACs). This reduction in the effective gate resistance may substantially improve the MOS varactor quality factor (e.g., by more than 15.6 times). Additionally, no other parts of the varactor or other radio frequency (RF) active devices are impacted.

Figure 9:
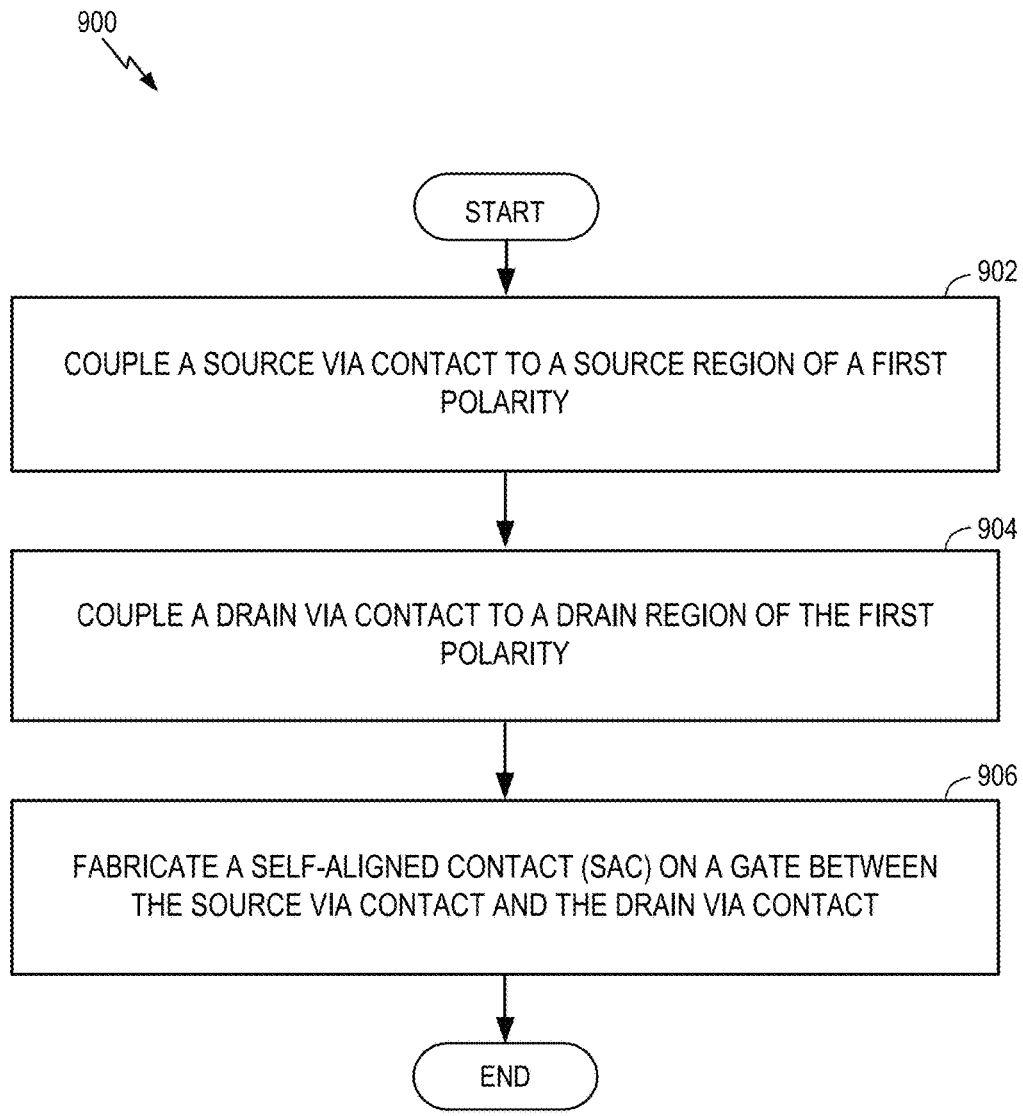
FIG. 9 illustrates a method for fabricating a short-channel metal oxide semiconductor (MOS) varactor, according to aspects of the present disclosure.

FIG. 9 is a process flow diagram illustrating a method 900 of fabricating a short-channel metal oxide semiconductor (MOS) varactor, according to aspects of the present disclosure. Fabricating the MOS varactor includes forming a source region of a first polarity, a drain region of the first polarity, and a channel region of the first polarity. The method 900 begins at block 902, in which a source via contact is coupled to the source region. A block 904, a drain via contact is coupled to the drain region. For example, as shown in FIG. 6A, the source and drain may be N doped, and the source and drain contacts may be on opposite sides of each other. In addition, an N doped channel region may be formed between the source region and the drain region. A gate of the MOS varactor may be on the channel region. At block 906, at least one self-aligned contact (SAC) is fabricated on the gate between the source via and the drain via. For example, as shown in FIGS. 6B and 7A-7C, there may be 1, 2, 4, or more than 4 self-aligned contacts.

According to an aspect of the present disclosure, a short-channel MOS varactor is described. In one configuration, the short-channel MOS varactor includes means for contacting. The contacting means may be one of the described self-aligned contacts, long self-alignment contacts, or multiple self-alignment contacts. In another aspect, the aforementioned means may be any module or any apparatus or material configured to perform the functions recited by the aforementioned means.

Figure 10:
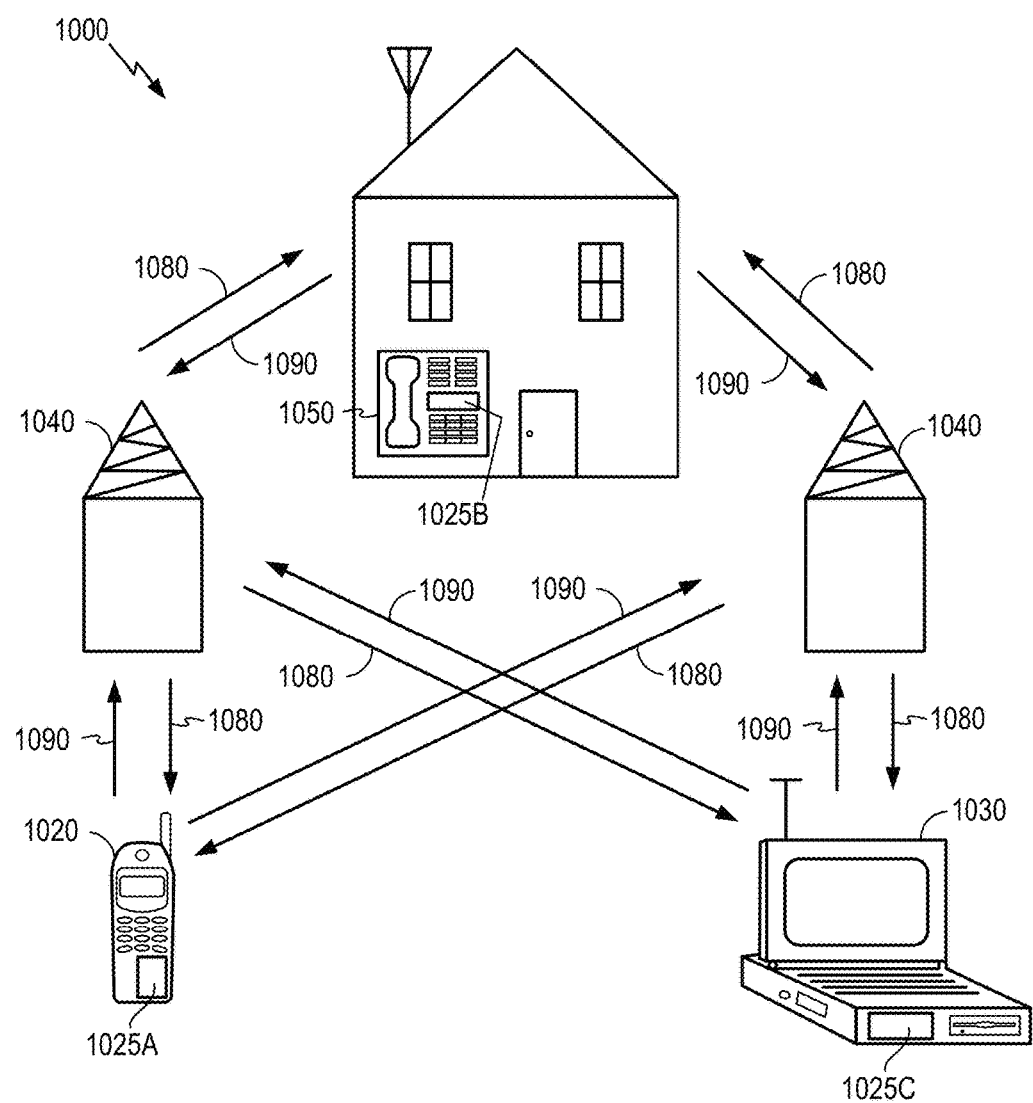
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed varactor. It will be recognized that other devices may also include the disclosed varactor, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed varactor.

Figure 11:
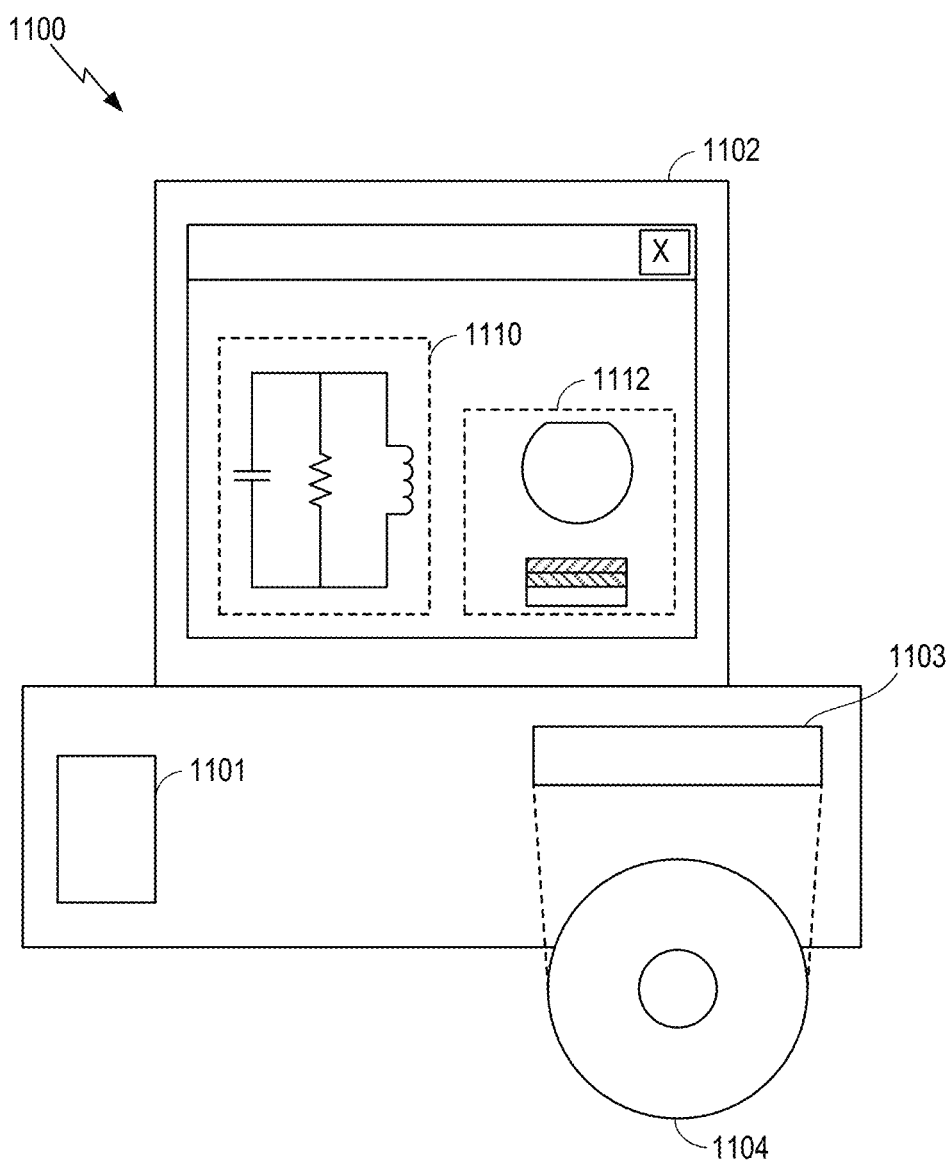
FIG. 11 is a block diagram illustrating a design workstation used for circuit, layout, and logic design of a fin-based structure according to one configuration.

FIG. 11 is a block diagram illustrating a design workstation used for circuit, layout, and logic design of an IC structure, such as the varactor disclosed above. A design workstation 1100 includes a hard disk 1101 containing operating system software, support files, and design software such as Cadence or OrCAD. The design workstation 1100 also includes a display 1102 to facilitate design of a circuit 1110 or a varactor structure 1112 including a CMOS transistor. A storage medium 1104 is provided for tangibly storing the design of the circuit 1110 or the varactor structure 1112. The design of the circuit 1110 or the varactor structure 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the varactor structure 1112 by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A short-channel metal oxide semiconductor varactor, comprising:
    a source region of a first polarity, including a source via contact;
    a drain region of the first polarity, including a drain via contact;
    a channel region of the first polarity between the source region and the drain region, the channel region including a gate; and
    multiple self-aligned contacts (SACs) on the gate.

2. The short-channel metal oxide semiconductor varactor of claim 1, in which the multiple SACs comprises a long self-aligned contact (LSAC).

3. The short-channel metal oxide semiconductor varactor of claim 1, in which a shape of at least one of the multiple SACs is cylindrical or square shaped.

4. The short-channel metal oxide semiconductor varactor of claim 1, in which at least one of the multiple SACs extends an entire length between the source via contact and the drain via contact.

5. The short-channel metal oxide semiconductor varactor of claim 1, in which at least one of the multiple SACs comprises copper (Cu), tungsten (W), nickel (Ni), aluminum (Al), gold (Au), silver (Ag), titanium (Ti), or graphene.

6. The short-channel metal oxide semiconductor varactor of claim 1, in which a width of at least one of the multiple SACs is greater than a length of the gate.

7. The short-channel metal oxide semiconductor varactor of claim 1, integrated into a mobile phone, a set top box, a music player, a video player, an entertainment unit, a navigation device, a computer, a hand-held personal communication systems (PCS) unit, a portable data unit, and/or a fixed location data unit.

8. A radio frequency (RF) front end module, comprising:
a filter, comprising a die, a substrate supporting the die, a molding compound surrounding the die, a short-channel metal oxide semiconductor (MOS) varactor, comprising a source region of a first polarity including a source via contact, a drain region of the first polarity including a drain via contact, a channel region of the first polarity between the source region and the drain region, the channel region including a gate, and at least one self-aligned contact (SAC) on the gate and between the source via contact and the drain via contact; and
an antenna coupled to an output of the filter.

9. The RF front end module of claim 8, in which the at least one SAC comprises multiple self-aligned contacts (MSACs).

10. The RF front end module of claim 8, in which a shape of the at least one SAC is cylindrical or square shaped.

11. The RF front end module of claim 8, in which the at least one SAC extends an entire length between the source via contact and the drain via contact.

12. The RF front end module of claim 8, in which the at least one SAC comprises copper (Cu), tungsten (W), nickel (Ni), aluminum (Al), gold (Au), silver (Ag), titanium (Ti), or graphene, or graphene.

13. The RF front end module of claim 8, integrated into a mobile phone, a set top box, a music player, a video player, an entertainment unit, a navigation device, a computer, a hand-held personal communication systems (PCS) unit, a portable data unit, and/or a fixed location data unit.

14. A method of fabricating a short-channel metal oxide semiconductor varactor, comprising:
coupling a source via contact to a source region of a first polarity;
coupling a drain via contact to a drain region of the first polarity; and
fabricating multiple self-aligned contacts (SACs) on a gate on a channel region of the first polarity.

15. The method of claim 14, in which the short-channel metal oxide semiconductor varactor is integrated into a mobile phone, a set top box, a music player, a video player, an entertainment unit, a navigation device, a computer, a hand-held personal communication systems (PCS) unit, a portable data unit, and/or a fixed location data unit.

16. The method of claim 14, wherein the multiple SACs are deposed between the source via contact and the drain via contact.

17. The short-channel metal oxide semiconductor varactor of claim 1, integrated into a radio frequency (RF) front end module.

18. The short-channel metal oxide semiconductor varactor of claim 1, wherein the multiple SACs on the gate are between the source via contact and the drain via contact.

19. The RF front end module of claim 8, comprising multiple self-aligned contacts on the gate.

* * * * *